(12) United States Patent
Lu

(10) Patent No.: US 11,417,533 B1
(45) Date of Patent: Aug. 16, 2022

(54) MANUFACTURING METHOD OF SEMICONDUCTOR STRUCTURE

(71) Applicant: CHANGXIN MEMORY TECHNOLOGIES, INC., Hefei (CN)

(72) Inventor: Jingwen Lu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/648,558

(22) Filed: Jan. 21, 2022

Related U.S. Application Data

(63) Continuation of application No. PCT/CN2021/120125, filed on Sep. 24, 2021.

(30) Foreign Application Priority Data

May 20, 2021 (CN) .......................... 202110553933.3

(51) Int. Cl.
*H01L 21/308* (2006.01)
*H01L 21/28* (2006.01)
*H01L 21/762* (2006.01)

(52) U.S. Cl.
CPC .... *H01L 21/3081* (2013.01); *H01L 21/76224* (2013.01); *H01L 29/4011* (2019.08)

(58) Field of Classification Search
None
See application file for complete search history.

(56) References Cited

U.S. PATENT DOCUMENTS

| 8,729,675 B1 | 5/2014 | Choi et al. |
| 2012/0040528 A1 | 2/2012 | Kim et al. |
| 2012/0153385 A1 | 6/2012 | Seo |
| 2015/0333059 A1 | 11/2015 | Lee et al. |
| 2017/0053920 A1 | 2/2017 | Kim et al. |
| 2017/0256413 A1 | 9/2017 | Yoon et al. |
| 2019/0267383 A1 | 8/2019 | Rocklein et al. |
| 2021/0359084 A1 | 11/2021 | Zhang et al. |

FOREIGN PATENT DOCUMENTS

| CN | 103794605 A | 5/2014 |
| CN | 111640747 A | 9/2020 |
| CN | 111771279 A | 10/2020 |
| CN | 112786444 A | 5/2021 |

OTHER PUBLICATIONS

International Search Report and English Translation cited in PCT/CN2021/120125 dated Jan. 28, 2022, 9 pages.
Written Opinion and English Translation cited in PCT/CN2021/120125 dated Jan. 28, 2022, 7 pages.

*Primary Examiner* — Xiaoming Liu
(74) *Attorney, Agent, or Firm* — Cooper Legal Group, LLC

(57) ABSTRACT

The present disclosure provides a method of manufacturing a semiconductor structure, including: providing a base; forming first mask layers and second mask layers on the base, wherein the first mask layers each extend along a first direction, the second mask layers each extend along a second direction, the first direction is different from the second direction, and the first mask layers intersect the second mask layers; cutting off the first mask layers to form first sub-mask layers, wherein the second mask layers each span a plurality of the first sub-mask layers, and partial sidewalls of each of the first sub-mask layers are covered by the second mask layers; etching the base by using a first etching process, to form active regions; forming a isolation structure; and forming word line trench.

15 Claims, 14 Drawing Sheets

MANUFACTURING METHOD OF SEMICONDUCTOR STRUCTURE

CROSS-REFERENCE TO RELATED APPLICATIONS

This is a continuation of International Application No. PCT/CN2021/120125, filed on Sep. 24, 2021, which claims the priority to Chinese Patent Application 202110553933.3, titled "MANUFACTURING METHOD OF SEMICONDUCTOR STRUCTURE" and filed on May 20, 2021. The entire contents of International Application No. PCT/CN2021/120125 and Chinese Patent Application 202110553933.3 are incorporated herein by reference.

TECHNICAL FIELD

The present disclosure relates to, but is not limited to, a method of manufacturing a semiconductor structure.

BACKGROUND

A dynamic random access memory (DRAM) is a type of semiconductor memory, which is widely used for computer systems and works mainly by using the presence or absence of charge stored in a capacitor to represent a binary bit.

The DRAM generally includes structures such as a base, a word line and active regions. At present, the active regions are generally formed by using a self-aligned double patterning (SADP) technology. However, in the forming process, the active regions are prone to tilt or collapse, which may cause structural failure and reduce the yield of a semiconductor structure.

SUMMARY

An overview of the subject matter detailed in the present disclosure is provided below, which is not intended to limit the protection scope of the claims.

The embodiments of the present disclosure provide a method of manufacturing a semiconductor structure. The method of manufacturing a semiconductor structure includes:

providing a base;

forming a plurality of discrete first mask layers and a plurality of discrete second mask layers on the base, wherein the first mask layers each extend along a first direction, the second mask layers each extend along a second direction, the first direction is different from the second direction, the first mask layers intersect the second mask layers, and the second mask layers each span a plurality of the first mask layers;

cutting off the first mask layers to form a plurality of discrete first sub-mask layers, wherein the second mask layers each span a plurality of the first sub-mask layers, and partial sidewalls of each of the first sub-mask layers are covered by the second mask layers;

etching the base through a first etching process by using the first sub-mask layers as a mask, to form discrete active regions;

forming a isolation structure located between adjacent active regions, and removing the first sub-mask layers not covered by the second mask layers; and after a part of each of the first sub-mask layers is removed, etching the active regions and the isolation structure by using the second mask layers as a mask, to form a word line trench.

Other aspects of the present disclosure are understandable upon reading and understanding of the accompanying drawings and detailed description.

BRIEF DESCRIPTION OF THE DRAWINGS

The embodiments of the present disclosure are described in detail below with reference to the drawings. Those of ordinary skill in the art should understand that many technical details are proposed in the embodiments of the present disclosure to make the present application better understood. However, even without these technical details and various changes and modifications made based on the following embodiments, the technical solutions claimed in the present disclosure may still be realized.

DETAILED DESCRIPTION

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some but not all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

Figure 1:
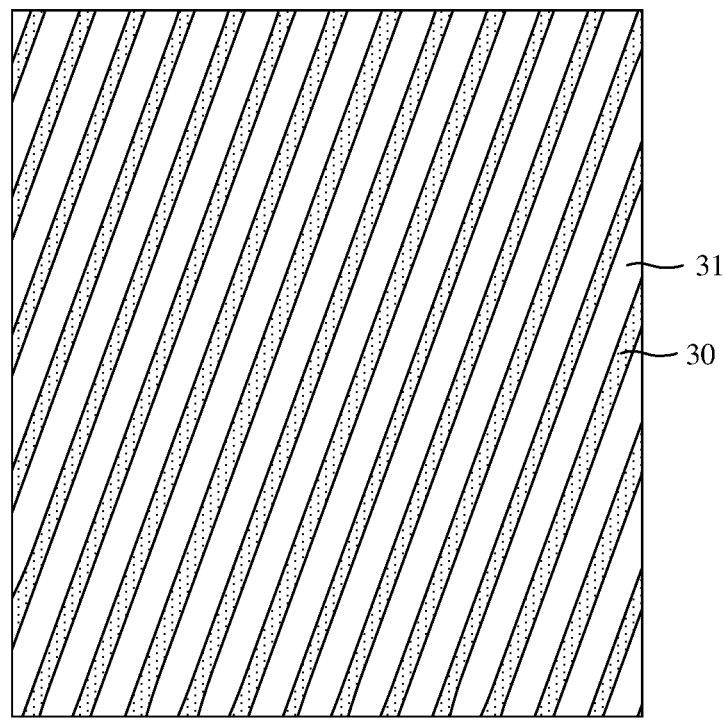
FIGS. 1 to 2 are schematic structural diagrams corresponding to various steps in a method of manufacturing a semiconductor structure.
Figure 2:
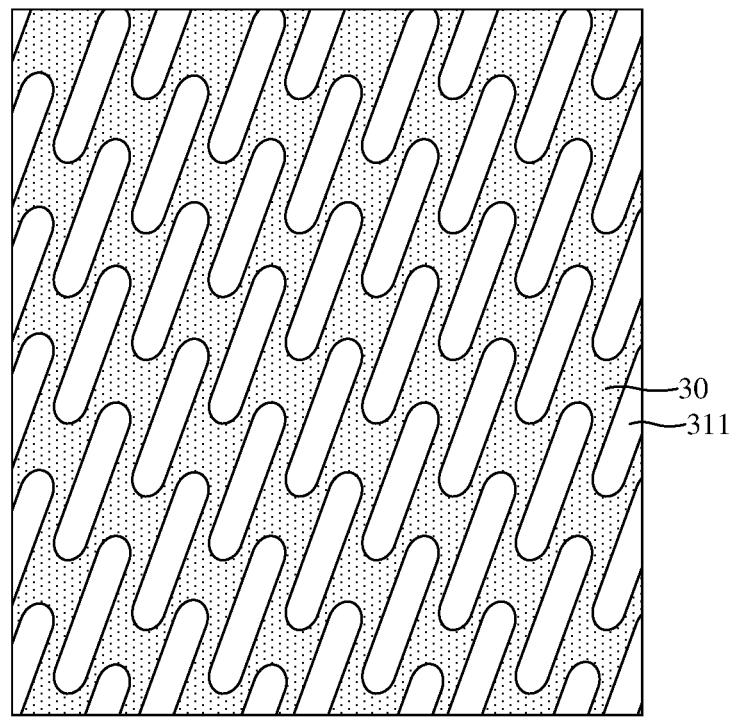

A dynamic random access memory (DRAM) generally includes structures such as a base, a word line and active regions. The active regions are generally formed by using a self-aligned double patterning (SADP) technology. However, in the forming process, the active regions are prone to tilt or collapse, which may cause structural failure and reduce the yield of a semiconductor structure. Therefore, the yield of the semiconductor structure needs to be further improved. FIGS. 1 to 2 are schematic structural diagrams corresponding to various steps in a method of manufacturing a semiconductor structure. Referring to FIG. 1, a base 30 is provided and stripe-shaped first mask layers 31 are formed on the base 30. Referring to FIG. 2, the first mask layers 31 (referring to FIG. 1) are cut off to form a plurality of discrete first sub-mask layers 311, and the first sub-mask layers 311 are a mask layer to subsequently form active regions. The first sub-mask layers 311 are a plurality of discrete structures, and there are no other structures to fix and support the first sub-mask layers 311. Therefore, in an etching process, the first sub-mask layers 311 are prone to shift and tilt. Referring to FIG. 2, the base 30 is etched by using the first sub-mask layers 311 as a mask, to form the active regions. There is no structure to fix the first sub-mask layers 311 and the active regions, and there is a greater etching depth.

Therefore, both the first sub-mask layers 311 and the active regions may collapse and tilt, thus reducing the yield of the semiconductor structure.

The embodiments of the present disclosure provide a method of manufacturing a semiconductor structure, including: forming a plurality of discrete first mask layers and a plurality of discrete second mask layers on a base, wherein the first mask layers intersect the second mask layers, and each of the second mask layers spans a plurality of the first mask layers; cutting off the first mask layers to form a plurality of discrete first sub-mask layers, wherein the second mask layers each span a plurality of the first mask layers to achieve an effect of supporting and fixing the first mask layers, thus preventing the first sub-mask layers from displacement or tilt; etching the base by using the first sub-mask layers as a mask, to form discrete active regions, wherein the second mask layers can achieve an effect of fixing and supporting the first sub-mask layers, such that the first sub-mask layers do not collapse or shift in a process of etching the active regions, moreover, the first sub-mask layers are in contact with the active regions, such that the second mask layers can also achieve an effect of fixing and supporting the active regions through the first sub-mask layers, thus preventing the active regions from shift or collapse; and after a part of each of the first sub-mask layers is removed, etching the active regions and isolation structure by using the second mask layers as a mask, to form a word line trench, wherein the second mask layers are also used as a mask layer to form the word line trench, thus simplifying the production process.

An embodiment of the present disclosure provides a semiconductor structure. FIGS. 3 to 25 are schematic structural diagrams corresponding to various steps in a method of manufacturing a semiconductor structure. The method of manufacturing a semiconductor structure is specifically described below with reference to the drawings.

Referring to FIGS. 3 to 12, a base 10 is provided, and a plurality of discrete first mask layers 11 and a plurality of discrete second mask layers 12 are formed on the base 10. The first mask layers 11 each extend along a first direction X, the second mask layers 12 each extend along a second direction Y, and the first direction X is different from the second direction Y. In addition, the first mask layers 11 intersect the second mask layers 12, and the second mask layers 12 each span a plurality of the first mask layers 11.

A material of the base 10 may be a semiconductor, and a material type of the base 10 may be an elemental semiconductor material or a crystalline inorganic compound semiconductor material. The elemental semiconductor material may be silicon or germanium; and the crystalline inorganic compound semiconductor material may be silicon germanium, gallium arsenide, indium gallium or the like.

An included angle between the first direction X and the second direction Y is 60° to 70°, the first direction X is an extension direction of the subsequently formed active regions, and the second direction Y is an extension direction of subsequently formed word line.

The second mask layers 12 each span a plurality of the first mask layers 11, that is, the second mask layers 12 are in contact with at least sidewalls of the first mask layers 11. In this way, the second mask layers 12 may each achieve an effect of supporting a plurality of the first mask layers 11 through adhesion of contact surfaces therebetween. In a subsequent process of etching the first mask layers 11 to form first sub-mask layers, the second mask layers 12 can fix the first sub-mask layers to prevent tilt or displacement. Moreover, in a subsequent process of etching the base 10 to form the active regions, the second mask layers 12 can also achieve an effect of fixing and supporting the active regions to prevent tilt or collapse.

The forming the first mask layers 11 and the second mask layers 12 is described in detail below.

It should be noted that, in the embodiment, the first mask layers 11 are formed before the second mask layers 12. In other embodiments, the second mask layers may also be formed before the first mask layers.

Referring to FIGS. 3 to 8, the first mask layers 11 are formed on the base 10.

Figure 3:
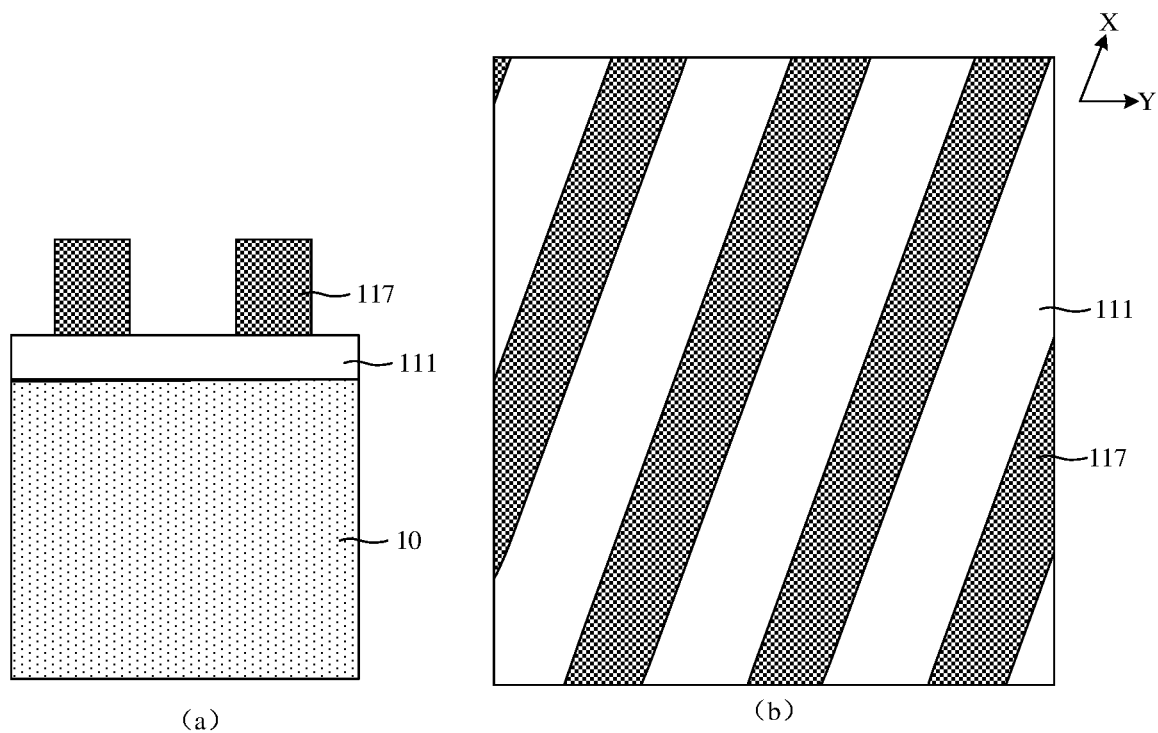
FIGS. 3 to 25 are schematic structural diagrams corresponding to various steps in a method of manufacturing a semiconductor structure according to an exemplary embodiment.

Referring to FIG. 3, FIG. 3(a) is a partial cross-sectional diagram of FIG. 3(b) in the direction Y, and FIG. 3(b) is a top view of the semiconductor structure. An initial first mask layer 111 is formed on the base 10 and covers an entire upper surface of the base 10. The initial first mask layer 111 is a hard mask. In the embodiment, a material of the initial first mask layer 111 is polysilicon. In other embodiments, the material of the initial first mask layer may also be silicon oxide, silicon nitride or silicon carbide. In the embodiment, the initial first mask layer 111 may be formed through chemical vapor deposition.

Discrete seventh mask layers 117 are formed on the initial first mask layer 111, and the seventh mask layers 117 each extend along the first direction X. In the embodiment, the seventh mask layers 117 are single-layer structures. In other embodiments, the seventh mask layers may also be double-layer structures, thus improving the precision of pattern transfer. The seventh mask layers 117 are hard masks, and a material thereof may be polysilicon, silicon oxide, silicon nitride or silicon carbide. In the embodiment, forming the seventh mask layers 117 includes: forming an initial seventh mask layer on an upper surface of the initial first mask layer 111; and patterning the initial seventh mask layer to form the seventh mask layers 117, which each extend along the first direction X. In the embodiment, the initial seventh mask layer may be formed through chemical vapor deposition, and may also be patterned through dry etching.

It should be noted that, in other embodiments, an initial eighth mask layer covering the initial first mask layer may also be formed before the seventh mask layers are formed, and the initial eighth mask layer may improve the precision of pattern transfer. The initial eighth mask layer may be a single-layer or double-layer structure, and a material thereof may be silicon nitride, silicon carbide or silicon oxynitride.

Figure 4:
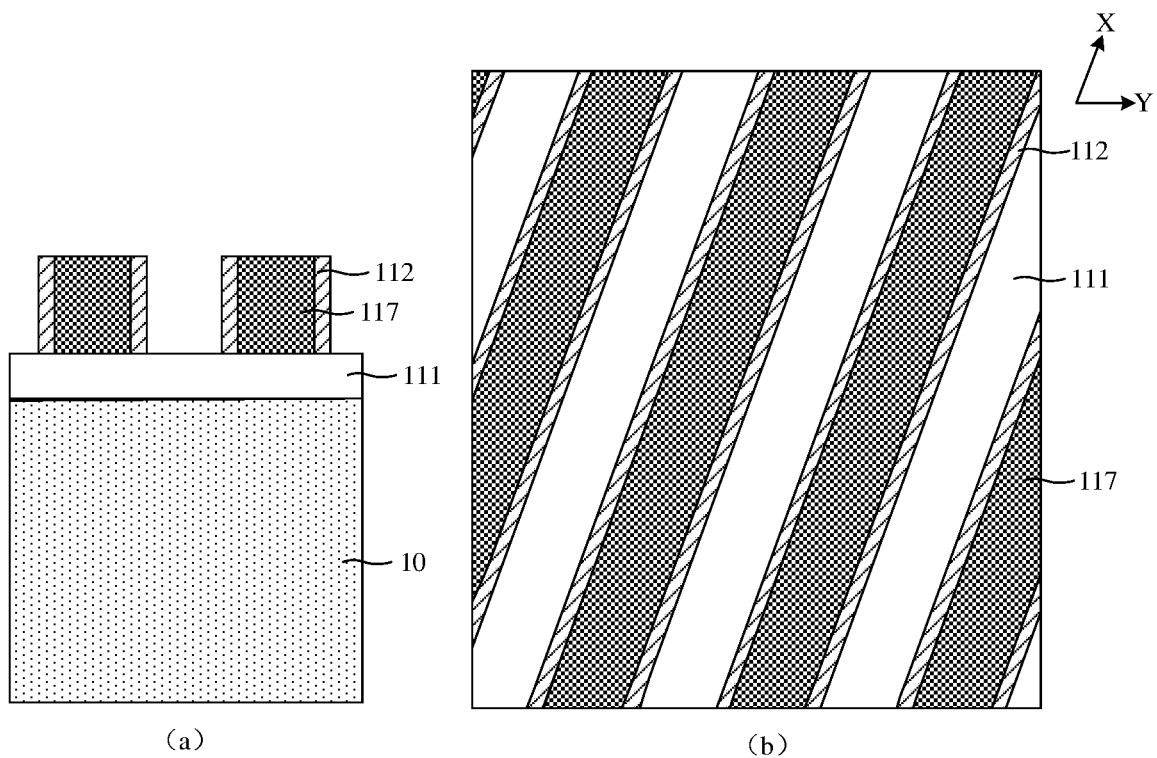

Referring to FIG. 4, FIG. 4(a) is a partial cross-sectional diagram of FIG. 4(b) in the direction Y, and FIG. 4(b) is a top view of the semiconductor structure. A first sidewall layer 112 is formed on each sidewall of the seventh mask layers 117. In the embodiment, in a direction perpendicular to the first direction X, the seventh mask layer 117 has a greater width than the first sidewall layer 112. The first sidewall layers 112 are hard masks, and a material thereof is different from the material of the seventh mask layers 117 and may be polysilicon, silicon oxide, silicon nitride or silicon carbide. The first sidewall layers 112 may be formed through an atomic layer deposition process or a chemical vapor deposition process.

Figure 5:
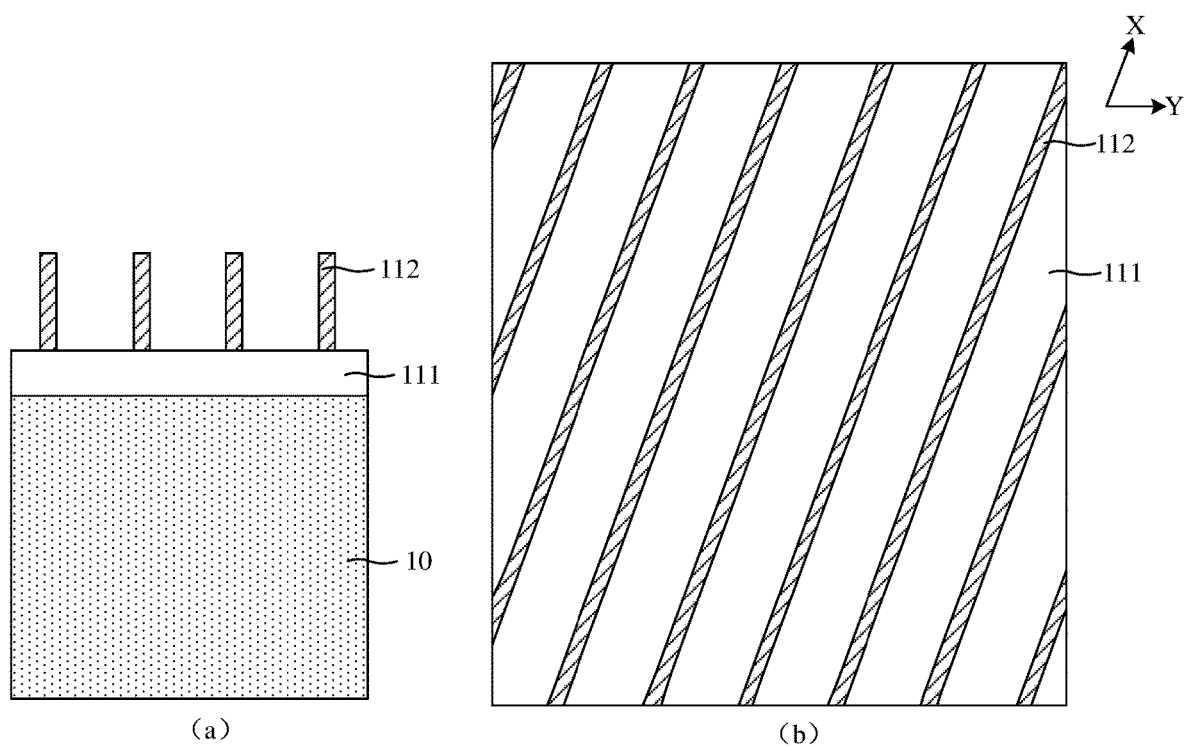

Referring to FIG. 5, FIG. 5(a) is a partial cross-sectional diagram of FIG. 5(b) in the direction Y, and FIG. 5(b) is a top view of the semiconductor structure. The seventh mask layers 117 (referring to FIG. 4) are removed and the first sidewall layers 112 are retained. In the embodiment, the seventh mask layers 117 may be removed through wet etching. In other embodiments, the seventh mask layers may also be removed through dry etching.

Figure 6:
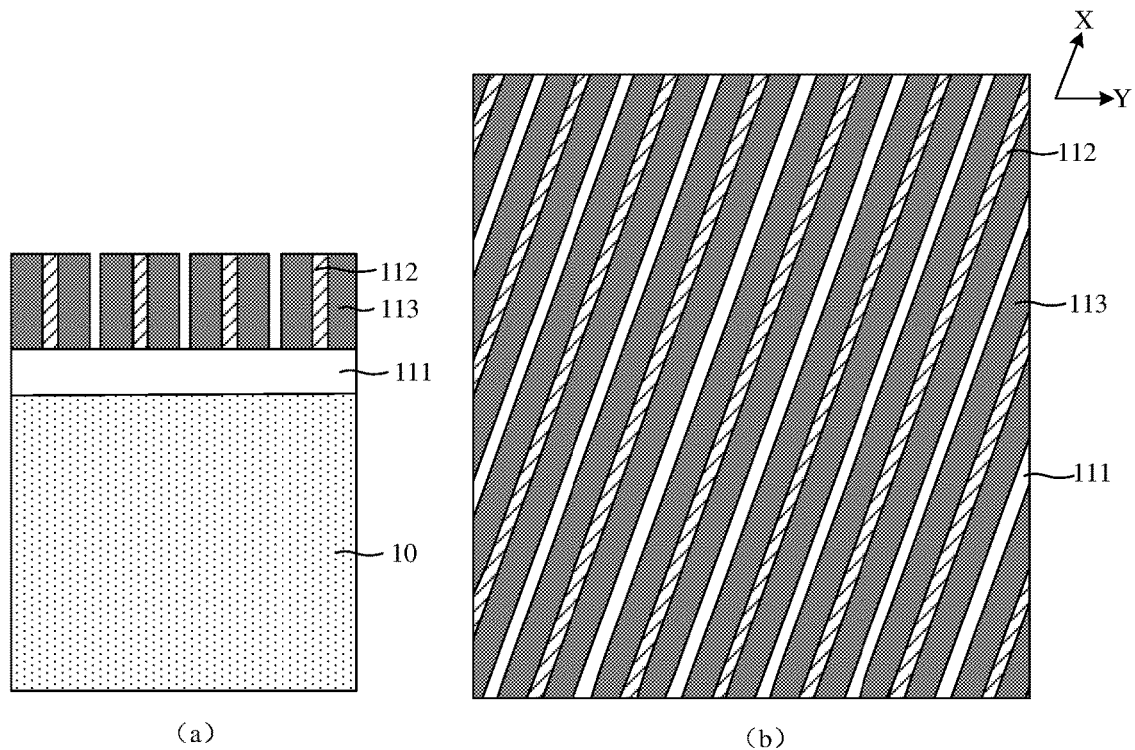

Referring to FIG. 6, FIG. 6(a) is a partial cross-sectional diagram of FIG. 6(b) in the direction Y, and FIG. 6(b) is a top view of the semiconductor structure. A second sidewall layer 113 is formed on each sidewall of the first sidewall layers 112. The second sidewall layers 113 are hard masks, and a material thereof is different from the material of the first sidewall layers 112 and may be polysilicon, silicon oxide, silicon nitride or silicon carbide. The second sidewall layers 113 may be formed through the atomic layer deposition process or the chemical vapor deposition process.

In other embodiments, the initial eighth mask layer may be formed on the initial first mask layer. Correspondingly, after the seventh mask layers are removed, the initial eighth mask layer may be etched by using the first sidewall layers as a mask, to form a plurality of discrete eighth mask layers, thus transferring patterns of the first sidewall layers to the eighth mask layers. In addition, a second sidewall layer may also be formed on each sidewall of the eighth mask layers.

Figure 7:
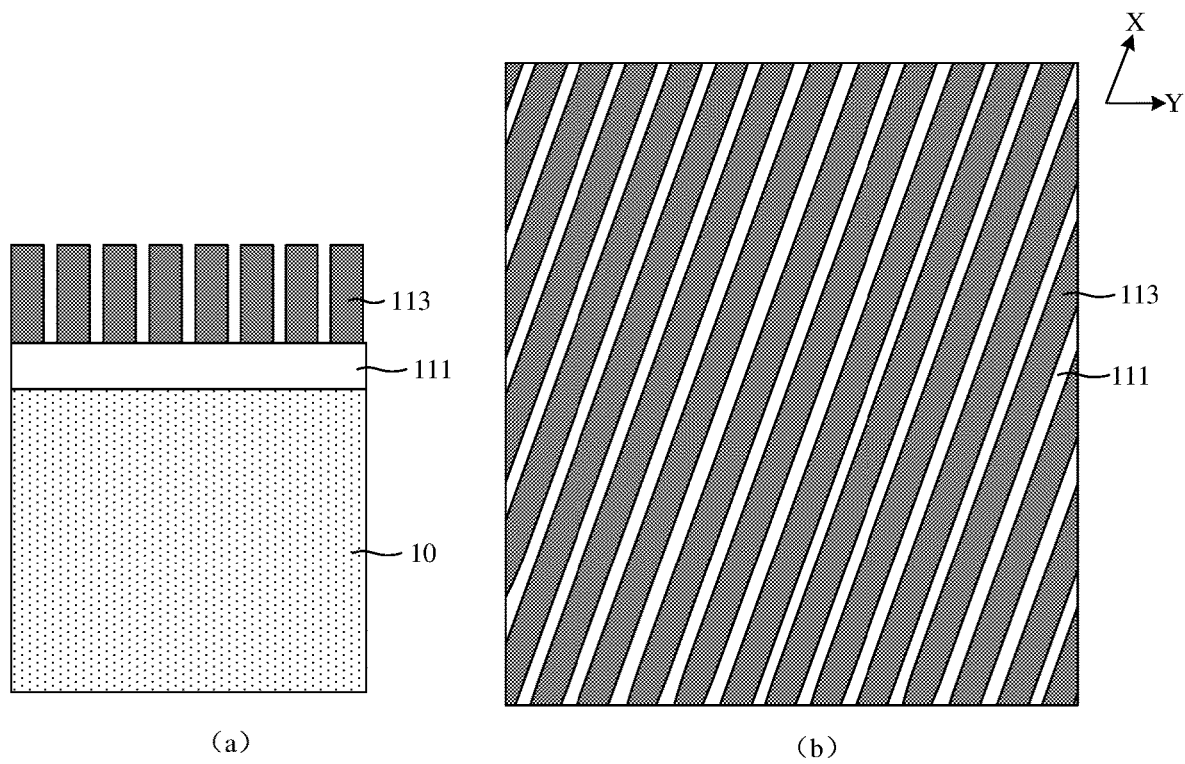

Referring to FIG. 7, FIG. 7(a) is a partial cross-sectional diagram of FIG. 7(b) in the direction Y, and FIG. 7(b) is a top view of the semiconductor structure. The first sidewall layers 112 (referring to FIG. 6) are removed, and the second sidewall layers 113 are retained. In the embodiment, the first sidewall layers 112 may be removed through wet etching. In other embodiments, the first sidewall layers may also be removed through dry etching.

It should be noted that, in other embodiments, a plurality of discrete eighth mask layers may be formed and a second sidewall layer is formed on each sidewall of the eighth mask layers. Correspondingly, the eighth mask layers may be removed after the second sidewall layers are formed.

Figure 8:
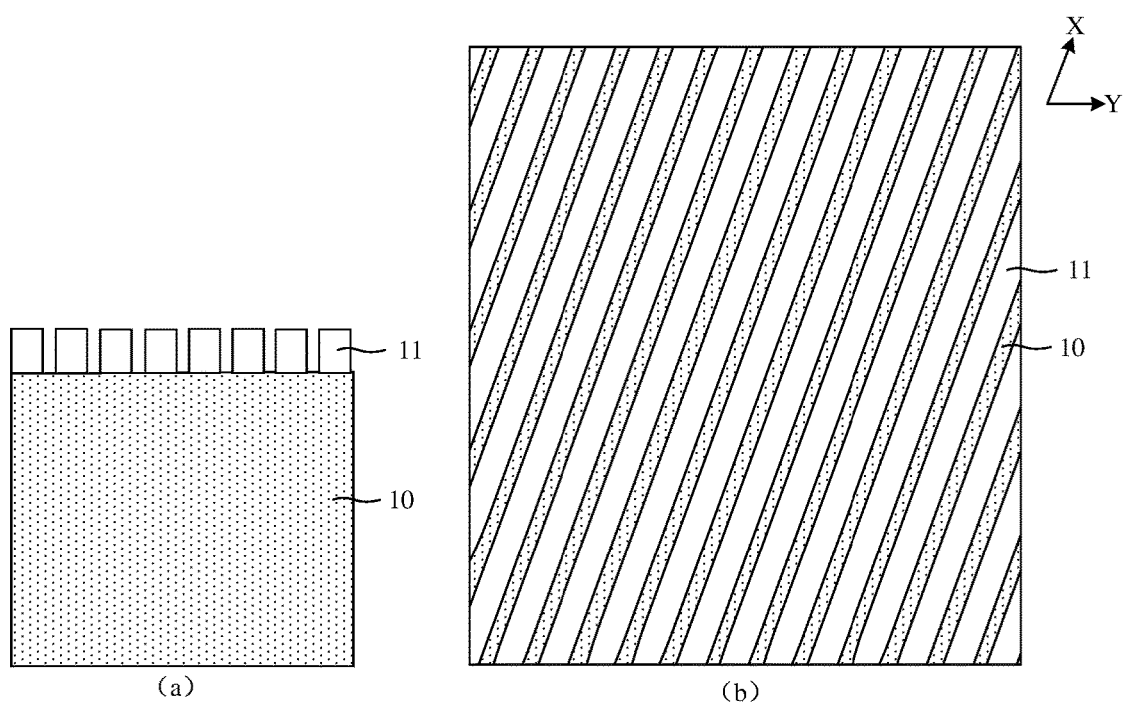

Referring to FIG. 8, FIG. 8(a) is a partial cross-sectional diagram of FIG. 8(b) in the direction Y, and FIG. 8(b) is a top view of the semiconductor structure. The initial first mask layer 111 (referring to FIG. 7) is etched by using the second sidewall layers 113 (referring to FIG. 7) as a mask, to form the first mask layers 11. The first mask layers 11 are stripe-shaped masks, which each extend along the first direction X, and the first mask layers 11 also expose partial upper surface of the base 10. The first mask layers 11 are hard mask layers. In the embodiment, a material of the first mask layers 11 is polysilicon. In other embodiments, the material of the first mask layers 11 may also be silicon oxide, silicon nitride or silicon carbide. The hard mask layer has higher hardness and strength, such that the effect of the subsequently formed second mask layers for supporting and fixing the first mask layers may be improved.

Referring to FIGS. 9 to 12, forming the second mask layers 12 is described in detail below.

Figure 9:
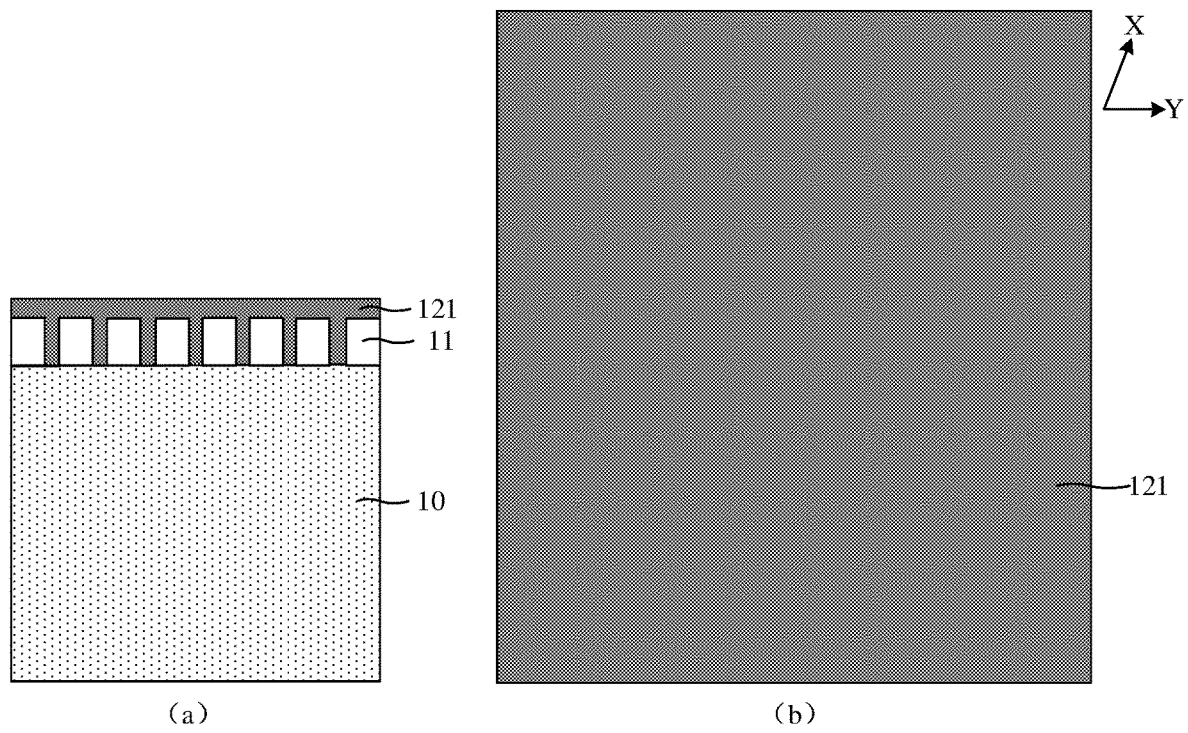

Referring to FIG. 9, FIG. 9(a) is a partial cross-sectional diagram of FIG. 9(b) in the direction Y, and FIG. 9(b) is a top view of the semiconductor structure. An initial second mask layer 121 located between adjacent first mask layers 11 is formed.

In the embodiment, the initial second mask layer 121 is also located on the first mask layers 11. That is, a top surface of the initial second mask layer 121 is higher than top surfaces of the first mask layers 11. It is understandable that, when the initial second mask layer 121 is still located on the first mask layers 11, the initial second mask layer 121 is also in contact with the top surfaces of the first mask layers 11. In this way, a contact area therebetween may be increased to increase the adhesion of the first mask layers 11 on a contact surface, thus improving the effect of the subsequently formed second mask layers for supporting the first mask layers 11. In other embodiments, the initial second mask layer may be located only between adjacent first mask layers. That is, the top surface of the initial second mask layer is flush with the top surfaces of the first mask layers or lower than the top surfaces of the first mask layers.

The initial second mask layer 121 is a hard mask layer, and a material thereof is different from the material of the first mask layers 11. In the embodiment, the material of the initial second mask layer 121 may be silicon carbide. In other embodiments, the material of the initial second mask layer may also be silicon nitride, silicon oxide or silicon carbonitride.

Figure 10:
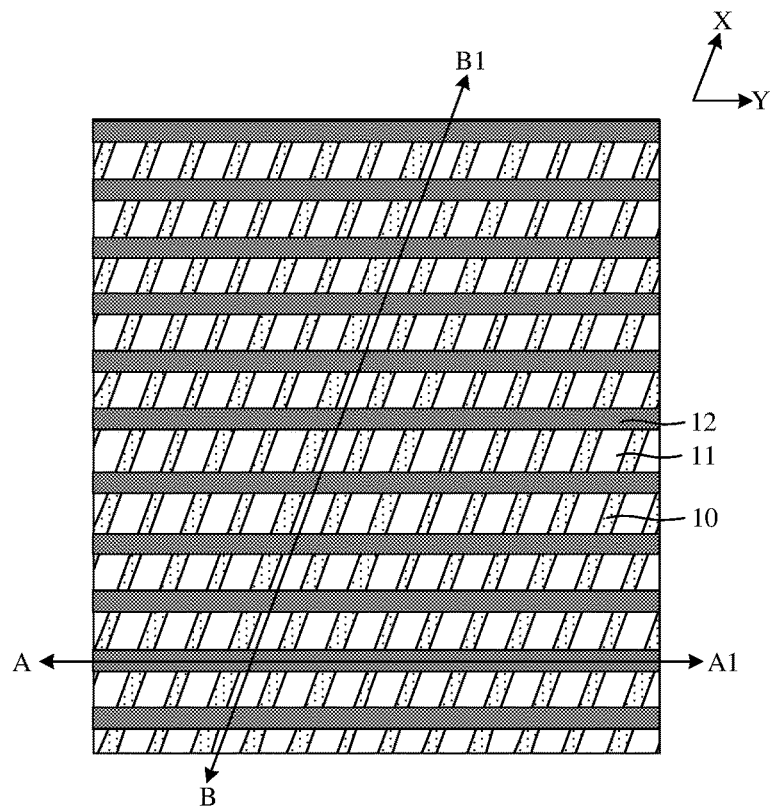
Figure 11:
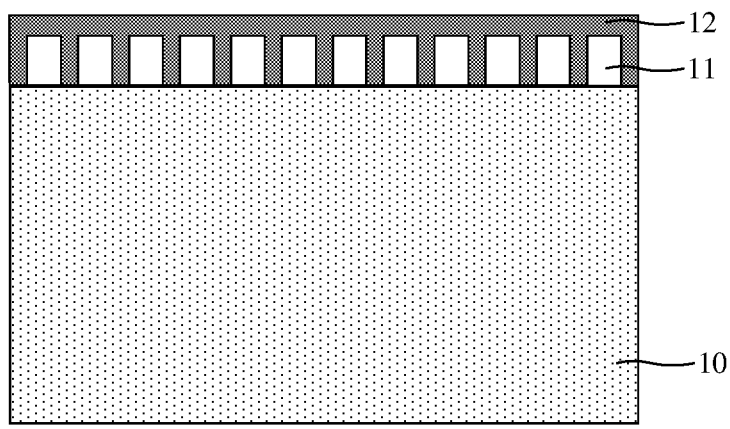
Figure 12:
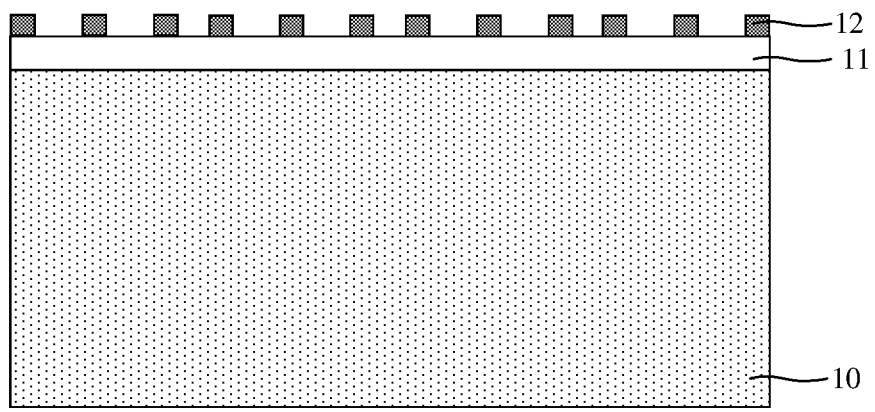

Referring to FIGS. 10 to 12, FIG. 11 is a cross-sectional diagram of FIG. 10 in an A-A1 direction, and FIG. 12 is a cross-sectional diagram of FIG. 10 in a B-B1 direction. The initial second mask layer 121 (referring to FIG. 9) is patterned by using a second etching process, to form the second mask layers 12.

In the embodiment, the second etching process has a higher etch selectivity for the initial second mask layer 121 and the first mask layers 11. In this way, in the process of etching the initial second mask layer 121, the first mask layers 11 are less damaged by the second etching process, thus maintaining the original shape of the first mask layers 11 and ensuring the precision of patterns of the subsequently formed active regions. In the embodiment, the material of the initial second mask layer 121 is silicon carbide. Correspondingly, an etching gas of the second etching process includes $O_2$ and Ar.

It can be known from the above that the initial second mask layer 121 (referring to FIG. 9) is also located on the first mask layers 11. Correspondingly, in a direction perpendicular to a top surface of the base 10, top surfaces of the second mask layers 12 are higher than the top surfaces of the first mask layers 11. It is understandable that, when the top surfaces of the second mask layers 12 are higher than the top surfaces of the first mask layers 11, the plurality of discrete second mask layers 12 located between adjacent first mask layers 11 are connected into a whole through the second mask layers 12 higher than the top surfaces of the first mask layers 11. The second mask layers 12 are not only in contact with the sidewalls of the first mask layers 11, but also in contact with the top surfaces of the first mask layers 11. That is, the second mask layers 12 may achieve an effect of hauling and fixing the first mask layers 11 through the sidewalls and the top surfaces of the first mask layers 11, thus preventing the first sub-mask layers from displacement or tilt in a subsequent process of forming the first sub-mask layers. In addition, the first sub-mask layers are also in contact with the base 10, such that in a subsequent process of etching the base 10 to form the active regions, the second mask layers 12 may also achieve an effect of fixing and supporting the active regions through the first sub-mask layers, thus preventing the active regions from collapse or tilt.

In other embodiments, the second mask layers may also be located only between adjacent first mask layers. That is, the second mask layers are discrete block structures, and are in contact with only the sidewalls of the first mask layers. That is, the second mask layers may achieve the effect of supporting and fixing the first mask layers through the sidewalls of the first mask layers.

In addition, the second mask layers 12 are hard mask layers, which may further improve the strength of the second mask layers 12 for supporting the first mask layers 11. Therefore, the first mask layers 11 and the subsequent active regions are prevented from tilt or collapse.

Referring to FIGS. 13 to 19, the first mask layers 11 are cut off to form a plurality of discrete first sub-mask layers 118. The second mask layers 12 each span a plurality of the first sub-mask layers 118, and partial sidewalls of each of the first sub-mask layers 118 are covered by the second mask layers 12.

In the embodiment, the second mask layers 12 are in contact with a central region and two edge regions of each of the first sub-mask layers 118. In other words, each of the first sub-mask layers 118 is in contact with three second mask layers 12 (the first mask layers 11 and the second mask layers 12 that are located at edges in the figure are not shown). The second mask layers 12 intersect the plurality of first sub-mask layers 118. Therefore, in the process of forming the first sub-mask layers 118, the second mask layers 12 may fix and support the plurality of first sub-mask layers 118, thus preventing the first sub-mask layers 118 from tilt or displacement.

The discrete first sub-mask layers 118 are used as a mask layer to subsequently form the active regions. The first sub-mask layers 118 are fixed by the second mask layers 12, thus improving the precision of the subsequently formed active regions. In addition, the first sub-mask layers 118 are also in contact with the active regions, such that the second mask layers 12 may also support and fix the active regions through the first sub-mask layers 118, thus preventing the active regions from tilt or collapse.

Forming the first sub-mask layers 118 is described in detail below.

Figure 13:
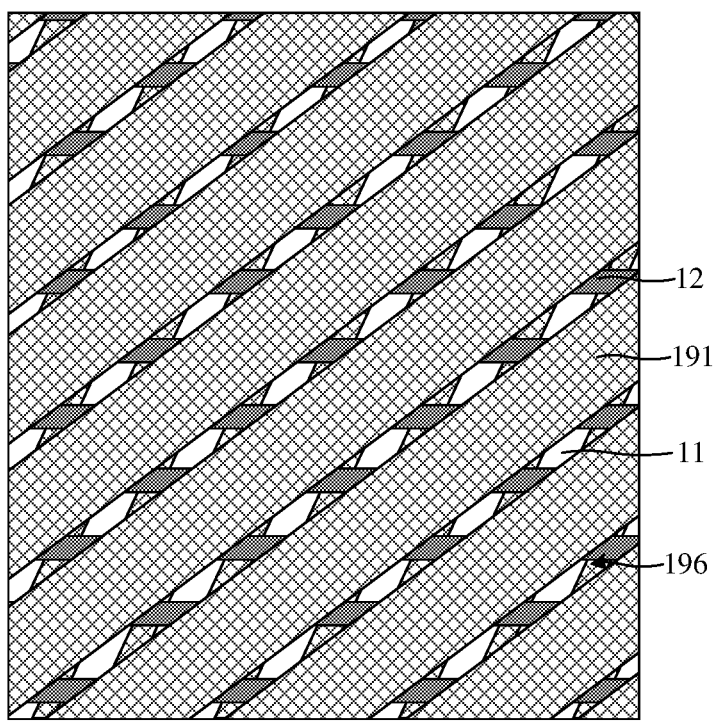

Referring to FIG. 13, fifth mask layer 191 is formed on the first mask layers 11, and is patterned to form second trenches 196 exposing the first mask layers 11 and the second mask layers 12. That is, the patterned fifth mask layer 191 may be formed through one-time photolithography. The patterned fifth mask layer 191 is stripe-shaped structures, and spans the plurality of first mask layers 11. In addition, the second trenches 196 expose to-be-cut regions of the plurality of first mask layers 11. The first mask layers 11 located in the to-be-cut regions are subsequently removed.

In the embodiment, partial material of the fifth mask layer 191 is filled between adjacent first mask layers 11 and between adjacent second mask layers 12. Correspondingly, after cutoff is performed, the material of the fifth mask layer 191 filled between adjacent first mask layers 11 and between adjacent second mask layers 12 is also removed.

Figure 14:
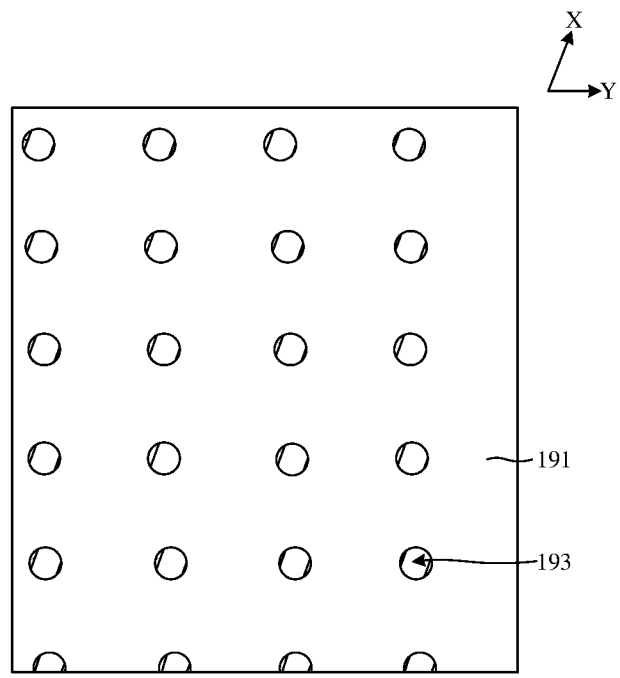
Figure 15:
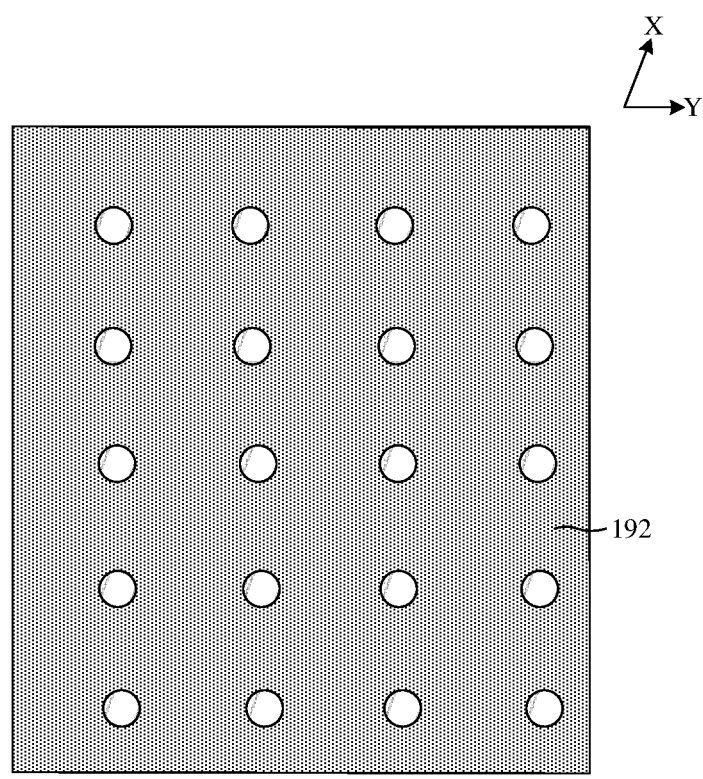
Figure 16:
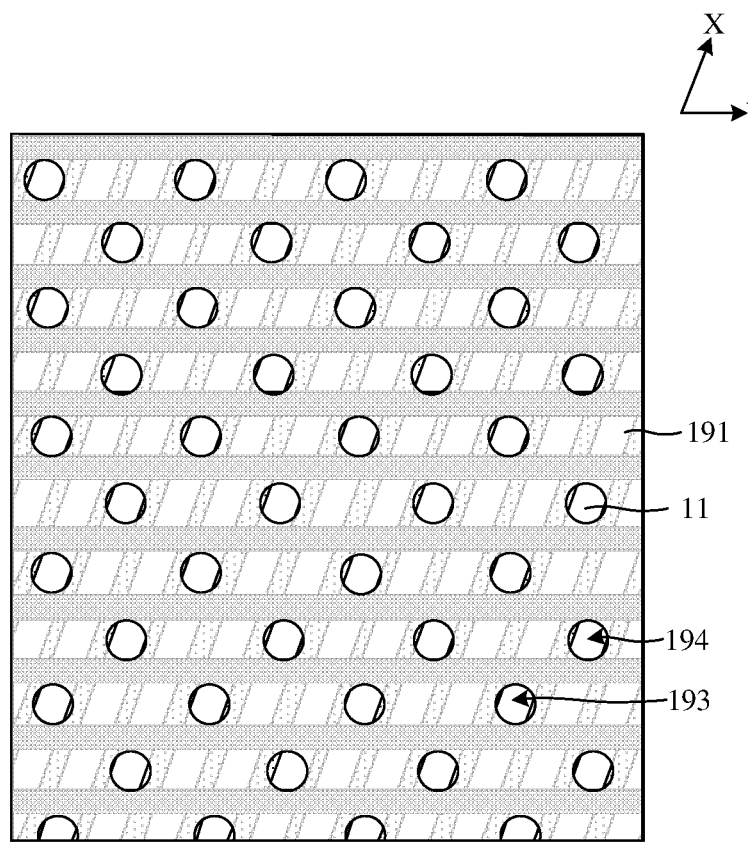

In the embodiment, the fifth mask layer 191 exposing all the to-be-cut regions of the first mask layers 11 is formed through a one-time photolithography process. In other embodiments, an upper mask layer and a lower mask layer may also be formed through a twice photolithography process. The upper mask layer corresponds to one part of the to-be-cut regions of the first mask layers, and the lower mask layer corresponds to the other part of the to-be-cut regions of the first mask layers. Referring to FIGS. 14 to 16, the fifth mask layer 191 is formed on the first mask layers 11, and is patterned to form discrete cutoff holes exposing the first mask layers 11. The cutoff holes include first cutoff holes 193 and second cutoff holes 194. For each of the first mask layers 11, orthographic projections of the first cutoff holes 193 and the second cutoff holes 194 on the top surface of the first mask layer 11 are alternately arranged.

Forming the cutoff holes is as follows: referring to FIG. 14, first patterning is performed on the fifth mask layer 191 to form the first cutoff holes 193; a first photoresist layer is formed on the fifth mask layer 191, and is exposed and shadowed to form patterned first photoresist layer; the fifth mask layer 191 is etched by using the patterned first photoresist layer as a mask, to form the first cutoff holes 193; and after the first cutoff holes 193 are formed, the patterned first photoresist layer is removed. Referring to FIG. 15, after the first cutoff holes 193 are formed, a sixth mask layer 192 is formed on the fifth mask layer 191, and is patterned to form initial second cutoff holes; a second photoresist layer is formed on the sixth mask layer 192, and is exposed and shadowed to form patterned second photoresist layer; the sixth mask layer 192 is etched by using the patterned second photoresist layer as a mask, to form a patterned sixth mask layer 192; and after the patterned sixth mask layer 192 is formed, the second photoresist layer is removed. Referring to FIG. 16, second patterning is performed on the fifth mask layer 191 by using the patterned sixth mask layer 192 as a mask, to form the second cutoff holes 194; and after the second cutoff holes 194 are formed, the sixth mask layer 192 is removed. Thus, the first cutoff holes 193 and the second cutoff holes 194 that are alternately arranged are formed on the fifth mask layer 191. The first mask layers 11 may be subsequently etched along the cutoff holes, to form the first sub-mask layers.

Figure 17:
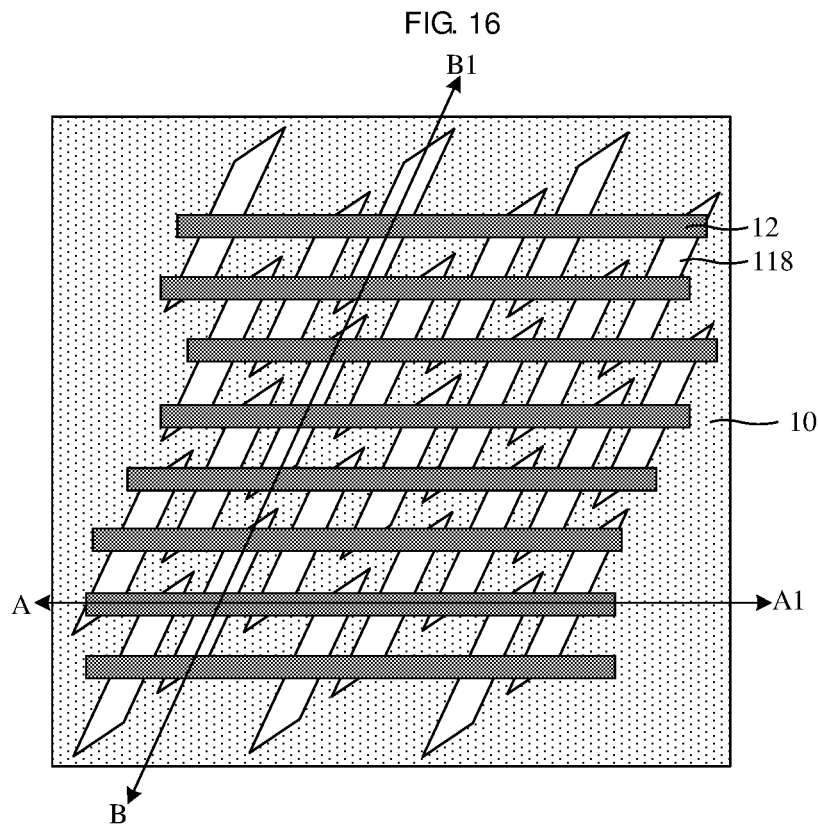
Figure 18:
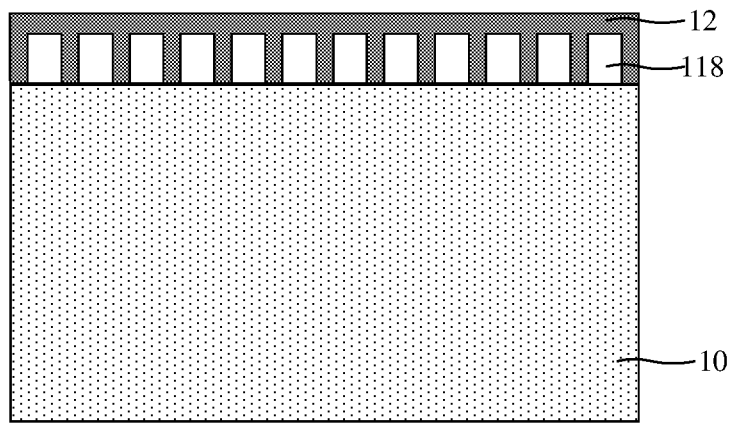
Figure 19:
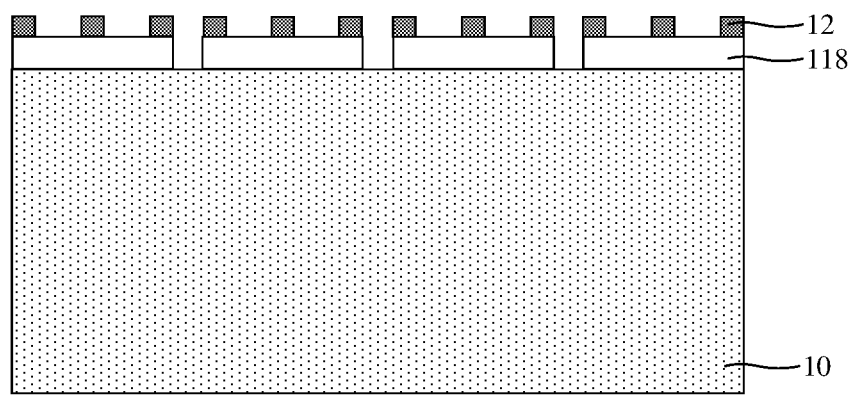

Referring to FIGS. 17 to 19, FIG. 17 is a partial top view of the semiconductor structure, FIG. 18 is a cross-sectional diagram of FIG. 17 in the A-A1 direction, and FIG. 19 is a cross-sectional diagram of FIG. 17 in the B-B1 direction. The first mask layers 11 are etched by using the fifth mask layer 191 as a mask, to form the first sub-mask layers 118.

It is understandable that, in the process of forming the first sub-mask layers 118, the second mask layers 12 may achieve the effect of hauling and fixing the first sub-mask layers 118, such that the first sub-mask layers 118 may be prevented from shift and displacement and benefit is brought to improve the precision of the patterns of the subsequently formed active regions.

In the embodiment, the first mask layers 11 are cut off through dry etching. In the embodiment, the material of the first mask layers 11 is polysilicon. Correspondingly, an etching gas may be $SF_6$, $CF_4$ or $Cl_2$.

Figure 20:
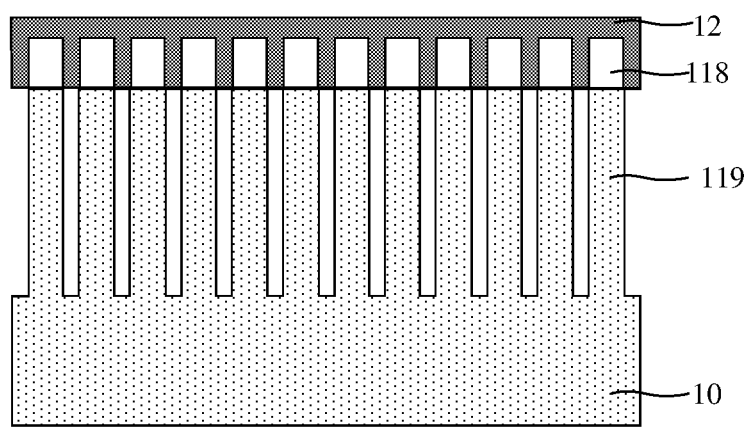
Figure 21:
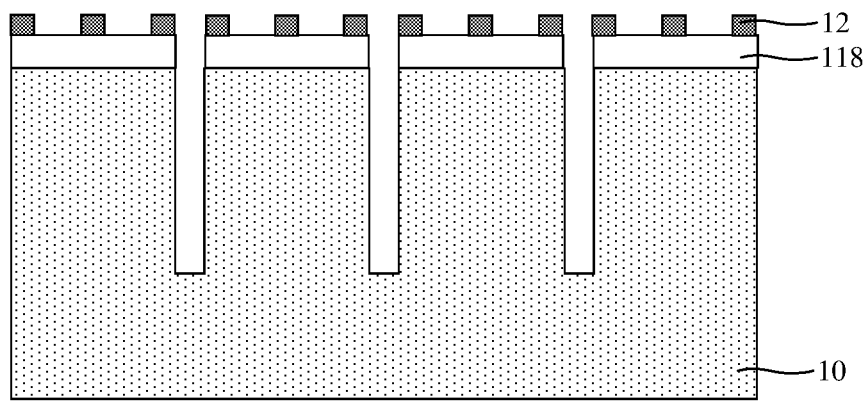

Referring to FIGS. 17, 20 and 21, FIG. 20 is a cross-sectional diagram of FIG. 17 in the A-A1 direction, and FIG. 21 is a cross-sectional diagram of FIG. 17 in the B-B1 direction. It should be noted that the top view of the semiconductor structure in the step is the same as the top view of the semiconductor structure in the previous step. The base 10 is etched through a first etching process by using the first sub-mask layers 118 as a mask, to form the discrete active regions 119.

In the embodiment, the first etching process is plasma etching. According to the plasma etching, parts of the base 10 are removed through ion beams. The first etching process may be divided into two stages. In the first stage, a direction of the ion beams is perpendicular to the top surface of the base 10. That is, the ion beams tilt 90° toward a bottom of the base along the first direction X, to remove parts of the base 10 not shielded by the first sub-mask layers 118 and the second mask layers 12. In the second stage, the ion beams tilt 0° to 30° toward the bottom of the base along the first direction X, to remove parts of the base 10 located right below the second mask layers 12, and the base 10 located right below the first sub-mask layers 118 is retained to form the plurality of mutually independent active regions 119. It is understandable that, in the second stage, the ion beams may etch sidewalls of the active regions 119 along the first direction X. To ensure that actual patterns of the active regions 119 are consistent with a target pattern, a thickness of the first sub-mask layers 118 may be suitably increased. That is, a loss allowance is previously stored for the active regions 119, and the loss allowance stored in the previous step may be removed through the plasma etching in the second stage. In other embodiments, sequences of the first stage and the second stage may also be exchanged, or there may be only the second stage.

The second mask layers 12 may haul and fix the active regions 119 through the first sub-mask layers 118. In this way, in the process of forming the active regions 119, the active regions 119 may be prevented from tilt or collapse, thus improving the yield of the semiconductor structure.

An etch selectivity of the first etching process for the base 10 and the second mask layers 12 is greater than 10, for example, 12, 20 or 50. When the etch selectivity is greater than 10, the first etching process may be prone to remove parts of the base 10 to form the discrete active regions 119, and may also prevent the second mask layers 12 from being excessively damaged, thus improving the effect of the second mask layers 12 for supporting the active regions 119.

An etching gas of the first etching process may be $SF_6$, $CF_4$, $Cl_2$, $CHF_3$, $O_2$, Ar or mixed gas thereof.

Figure 22:
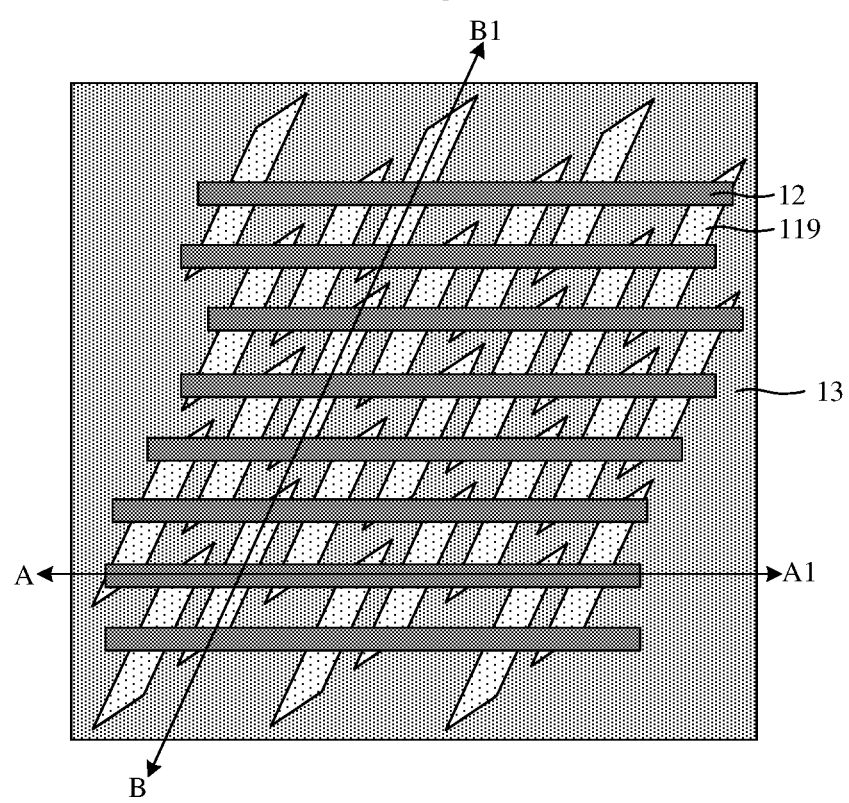
Figure 23:
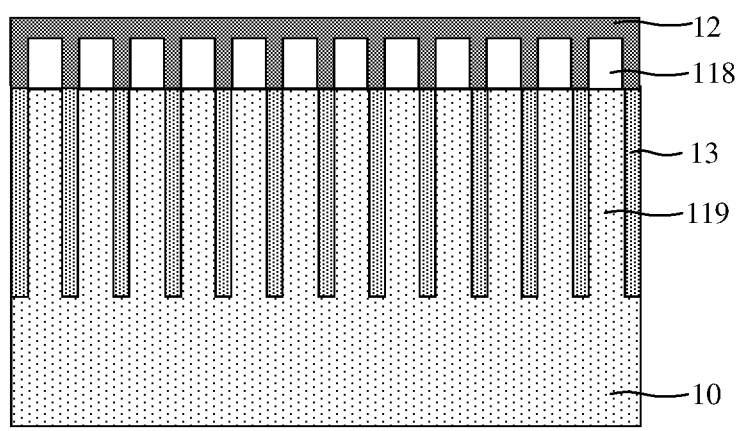
Figure 24:
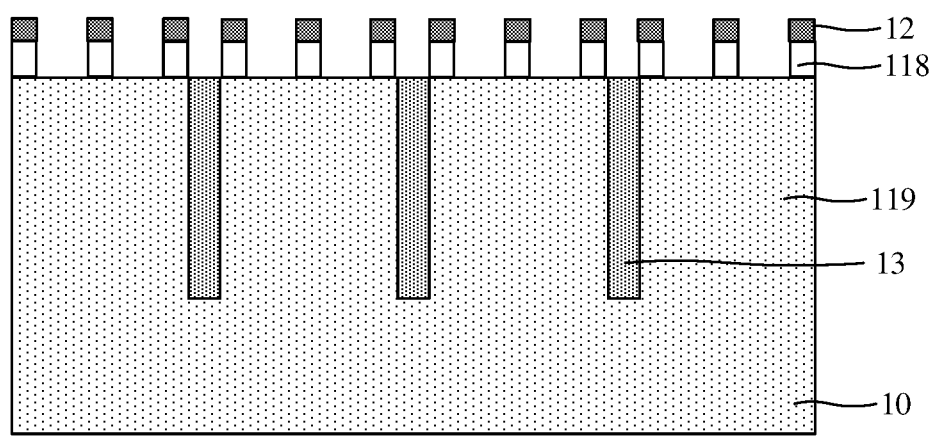

Referring to FIGS. 22 to 24, FIG. 23 is a cross-sectional diagram of FIG. 22 in the A-A1 direction, and FIG. 24 is a cross-sectional diagram of FIG. 22 in the B-B1 direction. A isolation structure 13 located between adjacent active regions 119 is formed, and the first sub-mask layers 118 not covered by the second mask layers 12 are removed.

In the embodiment, the isolation structure 13 may be formed through a chemical vapor deposition method. In other embodiments, the isolation structure may also be formed through a physical vapor deposition method. A material of the isolation structure 13 may be silicon oxide, silicon nitride or silicon oxynitride.

In the embodiment, the first sub-mask layers 118 not covered by the second mask layers 12 are removed. That is, the first sub-mask layers 118 located in the second mask layers 12 are retained. In the embodiment, a part of each of the first sub-mask layers 118 may be removed through dry etching.

Figure 25:
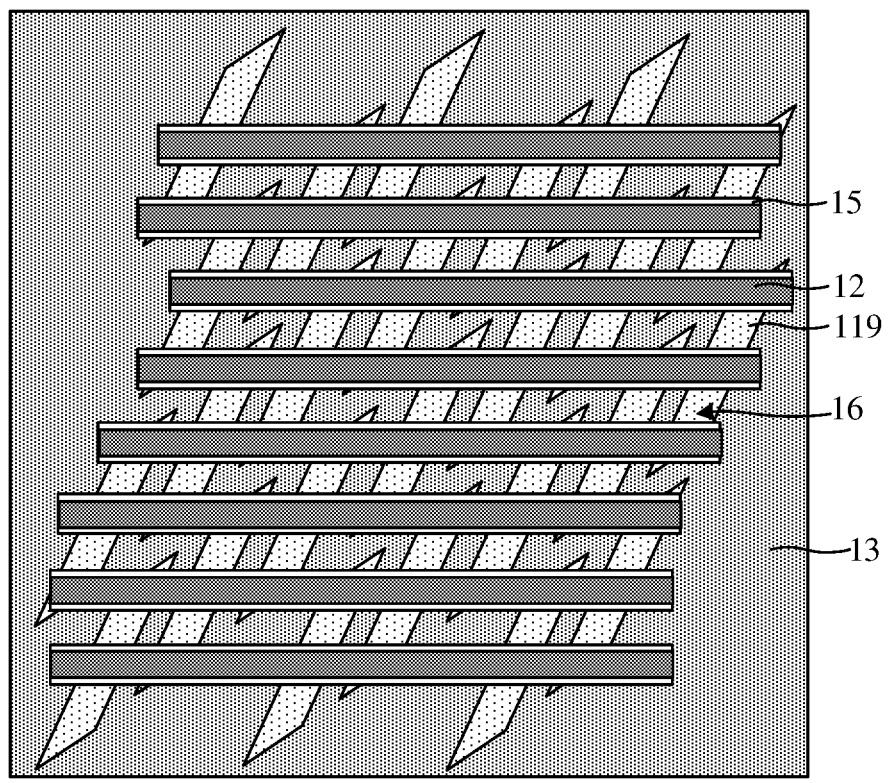

Referring to FIG. 25, third mask layers 15 are formed on two opposite sidewalls of each of the second mask layers 12. The active regions 119 and the isolation structure 13 are etched by using the second mask layers 12 and the third mask layers 15 as a mask, to form a word line trench 16.

The third mask layers 15 are formed before the active regions 119 and the isolation structure 13 are etched. The third mask layers 15 are used to finely adjust positions and sizes of the word line trench 16. In addition, in the process of cutting off the first mask layers 11 (referring to FIG. 13), the third mask layers 15 are not formed. That is, the third mask layers 15 do not shield a part of each of the to-be-cut regions of the first mask layers 11. In this way, the difficulty of cutting off the first mask layers 11 may be reduced by a larger process window.

In a direction perpendicular to the second direction Y, a ratio of a width of the second mask layer 12 to a width of the third mask layer 15 is 4:1 to 6:1. It is understandable that, if the width of the second mask layer 12 is excessively large, the difficulty of cutting off the first mask layers 11 may be increased; and if the width of the second mask layer 12 is excessively small, the effect of the second mask layers 12 for supporting and fixing the first mask layers 11 may be reduced. When the ratio of the width of the second mask layer 12 to the width of the third mask layer 15 is 4:1 to 6:1, the precision of a size of the word line trench can be ensured. Meanwhile, the difficulty of cutting off the first mask layers 11 can be reduced, and the effect of the second mask layers 12 for supporting the first mask layers 11 can be improved.

It is understandable that, in other embodiments, the third mask layers may also not be formed on the sidewalls of the second mask layers. Correspondingly, the width of the third mask layer in the direction perpendicular to the second direction Y may be increased. Subsequently, the active regions and the isolation structure may be directly etched by using the second mask layers as a mask.

After the word line trench 16 is formed, a word line filling the word line trench 16 is formed.

To sum up, in the embodiment, the first mask layers 11 intersect the second mask layers 12. Therefore, in the process of cutting off the first mask layers 11, the second mask layers 12 may achieve the effect of supporting and fixing the first mask layers 11, thus preventing the first sub-mask layers 118 from displacement or tilt. Moreover, the first sub-mask layers 118 are in contact with the active regions 119. In this way, the second mask layers 12 may achieve the effect of fixing and supporting the active regions 119 through the first sub-mask layers 118, thus preventing the active regions from shift or collapse and improving the yield of the semiconductor structure. The second mask layers 12 are also used as a mask layer to form the word line trench 16, thus simplifying the production process.

Another embodiment of the present disclosure provides a method of manufacturing a semiconductor structure. The embodiment is substantially the same as the previous embodiment, and the main difference lies in that, in the embodiment, the second mask layers are formed before the first mask layers. For the parts of the embodiment that are the same as or similar to the previous embodiment, refer to the first embodiment. Details are not described herein again. FIGS. 26 to 31 are schematic structural diagrams corresponding to various steps of a method of manufacturing a semiconductor structure according to the embodiment of the present disclosure.

The method of manufacturing a semiconductor structure is specifically described below with reference to the drawings.

Figure 26:
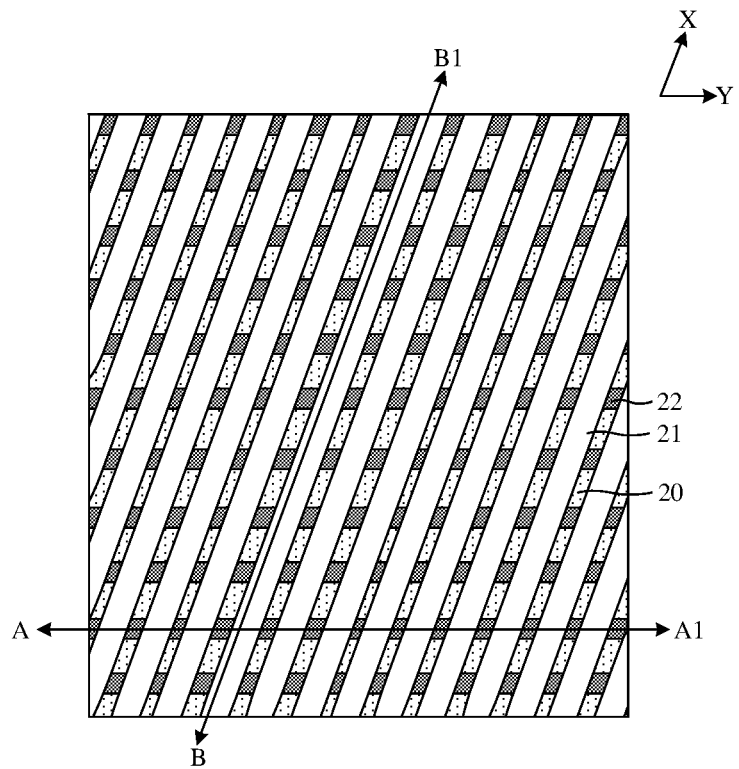
FIGS. 26 to 31 are schematic structural diagrams corresponding to various steps in a method of manufacturing a semiconductor structure according to an exemplary embodiment.
Figure 27:
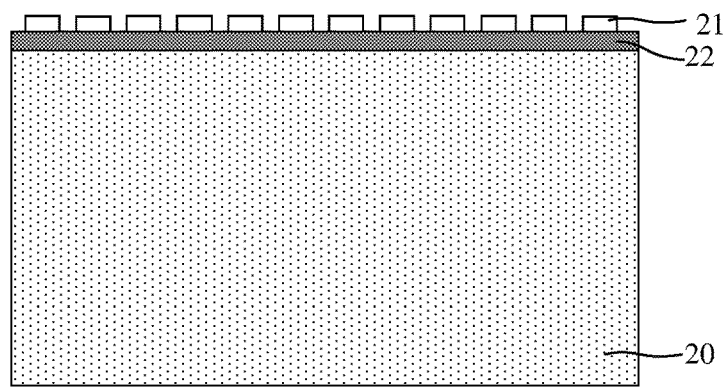
Figure 28:
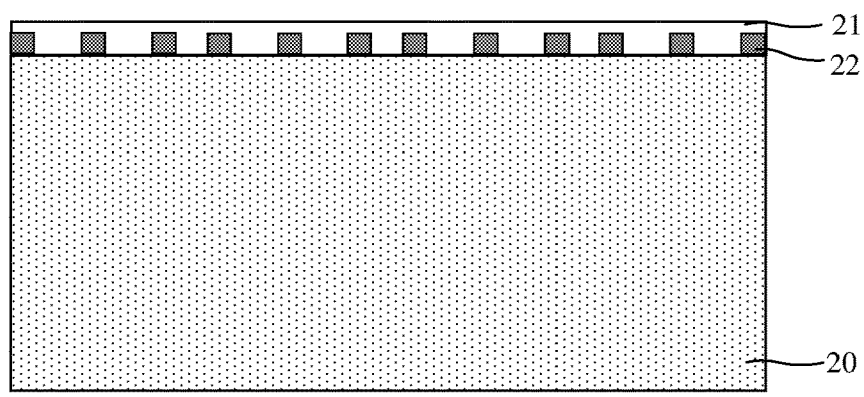

Referring to FIGS. 26 to 28, FIG. 27 is a cross-sectional diagram of FIG. 26 in the A-A1 direction, and FIG. 28 is a cross-sectional diagram of FIG. 26 in the B-B1 direction. A base 20 is provided, and a plurality of discrete first mask layers 21 and a plurality of discrete second mask layers 22 are formed on the base 20. The first mask layers 21 each extend along a first direction X, the second mask layers 22 each extend along a second direction Y, and the first direction X is different from the second direction Y. In addition, the first mask layers 21 intersect the second mask layers 22, and the second mask layers 22 each span a plurality of the first mask layers 21.

Forming the second mask layers 22 is as follows: an initial second mask layer which is a whole mask layer covering the base is formed on the base 20; and the initial second mask layer is patterned to form the discrete second mask layers. For the forming the second mask layers, refer to detailed description in the previous embodiment.

Forming the first mask layers 21 are as follows: an initial first mask layer located between adjacent second mask layers 22 is formed, and discrete seventh mask layers are formed on the initial first mask layer, wherein the seventh mask layers each extend along the first direction; a first sidewall layer is formed on each sidewall of the seventh mask layers; the seventh mask layers are removed, and a second sidewall layer is formed on each sidewall of the first sidewall layers; and the first sidewall layers are removed, and the initial first mask layer is etched by using the second sidewall layers as a mask, to form the first mask layers. For the forming the first mask layers, refer to detailed description in the previous embodiment.

In the embodiment, the initial first mask layer is also located on the second mask layers 22. Correspondingly, the first mask layers 21 are also located on the second mask layers 22. That is, top surfaces of the first mask layers 21 are higher than top surfaces of the second mask layers 22, and the first mask layers 21 are in contact with sidewalls and the top surfaces of the second mask layers 22. Therefore, the second mask layers 22 may achieve an effect of supporting the plurality of first mask layers 21 through the sidewalls and the top surfaces. In this way, in a subsequent process of etching the first mask layers 21 to form first sub-mask layers, the second mask layers 22 can fix the first sub-mask layers to prevent tilt or displacement. Moreover, in a subsequent process of etching the base to form active regions, the second mask layers 22 can also achieve an effect of fixing and supporting the active regions to prevent tilt or collapse.

In other embodiments, the initial first mask layer may also be located only between two adjacent second mask layers. Correspondingly, the first mask layers are located only between two opposite sidewalls of each of the second mask layers. That is, the top surfaces of the first mask layers are flush with or lower than the top surfaces of the second mask layers. In addition, sidewalls of the first mask layers in contact with the second mask layers also have adhesion, such that the second mask layers may support and fix the first mask layers through the sidewalls.

Figure 29:
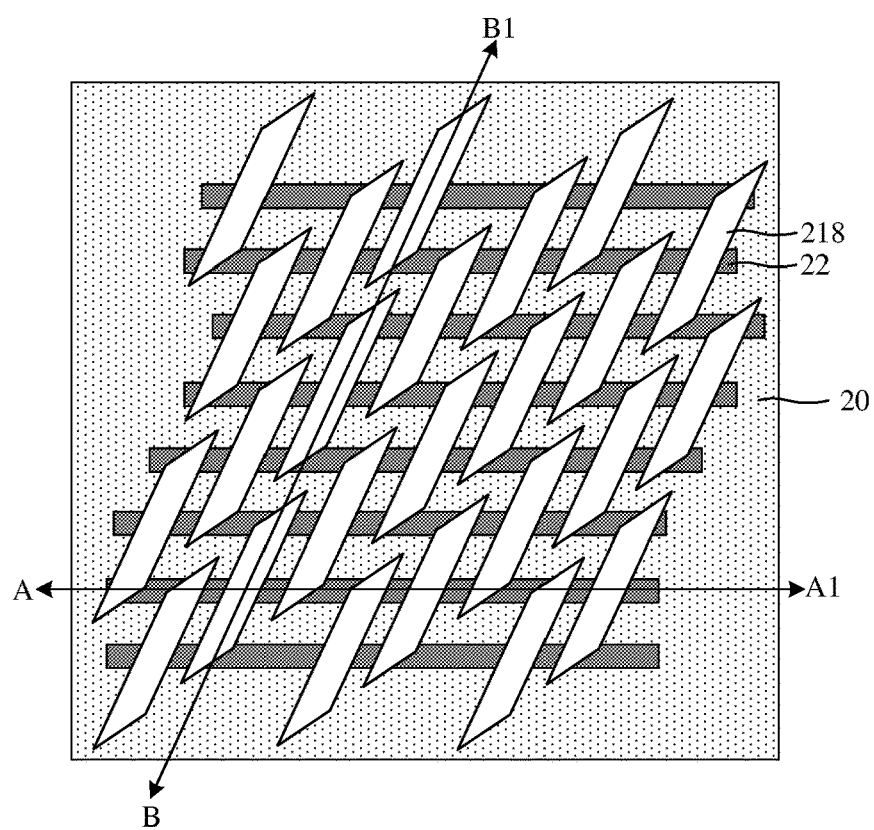
Figure 30:
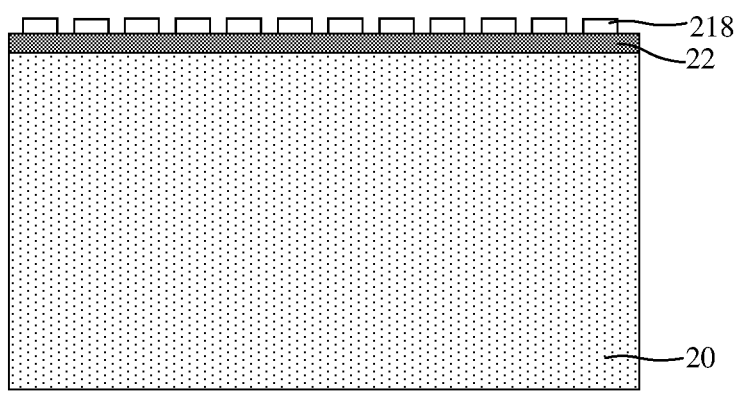
Figure 31:
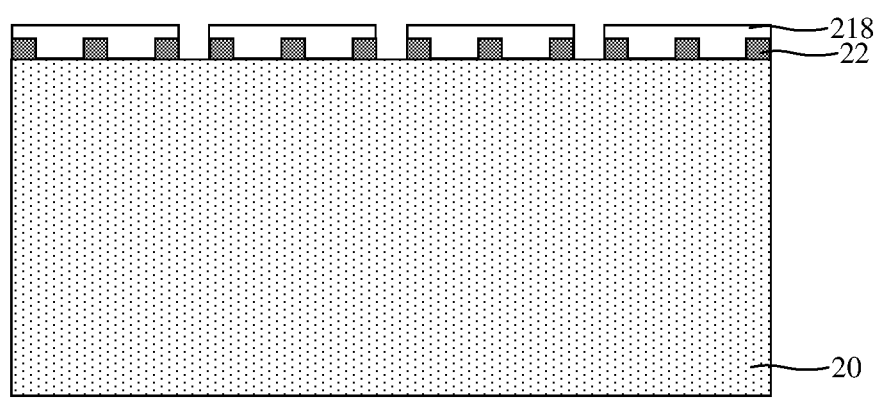

Referring to FIGS. 29 to 31, FIG. 30 is a cross-sectional diagram of FIG. 29 in the A-A1 direction, and FIG. 31 is a cross-sectional diagram of FIG. 29 in the B-B1 direction. The first mask layers 21 are cut off to form a plurality of discrete first sub-mask layers 218. The second mask layers 22 each span a plurality of the first sub-mask layers 218, and partial sidewalls of each of the first sub-mask layers 218 are covered by the second mask layers 22.

It can be known from the above that the first mask layers 21 are in contact with the top surfaces and sidewalls of the second mask layers 22, such that the second mask layers 22 may achieve an effect of fixing and supporting the first mask layers 21, thus preventing the first sub-mask layers 218 from shift or tilt.

The base is etched through a first etching process by using the first sub-mask layers 218 as a mask, to form discrete active regions. In the process of forming the active regions, the second mask layers 22 may support and fix the active regions through the first sub-mask layers 218, thus preventing the active regions from collapse or tilt.

A isolation structure located between adjacent active regions is formed, and the first sub-mask layers 218 not covered by the second mask layers 22 are removed. In addition, after a part of each of the first sub-mask layers 218 is removed, the isolation structure and the active regions may be etched by using the second mask layers 22 as a mask, to form a word line trench. For detailed descriptions of the foregoing steps, refer to the previous embodiment. Details are not described herein again.

To sum up, in the embodiment, the second mask layers 22 are firstly formed, and then the first mask layers 21 are formed. The first mask layers 21 intersect the second mask layers 22, such that the second mask layers 22 may fix and support the subsequently formed first sub-mask layers 218 and the subsequently formed active regions, thus preventing the first sub-mask layers 218 and the active regions from collapse or tilt. In this way, the yield of the semiconductor structure can be improved. In addition, the second mask layers are also used to form the word line trench, thus simplifying the production process.

The embodiments or implementations of this specification are described in a progressive manner, and each embodiment focuses on differences from other embodiments. The same or similar parts between the embodiments may refer to each other.

In the descriptions of this specification, a description with reference to the term "one implementation", "some implementations", "an exemplary implementation", "an example", "a specific example", "some examples", or the like means that a specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

Finally, it should be noted that the foregoing embodiments are used only to explain the technical solutions of the present disclosure, but are not intended to limit the present disclosure. Although the present disclosure has been described in detail with reference to the foregoing embodiments, those of ordinary skill in the art should understand that they can still modify the technical solutions described in the foregoing embodiments, or make equivalent substitutions on some or all technical features therein. The modifications or substitutions do not make the essence of the corresponding technical solutions deviate from the spirit and scope of the technical solutions of the embodiments of the present disclosure.

INDUSTRIAL APPLICABILITY

In the method of manufacturing a semiconductor structure provided by the embodiments of the present disclosure, the second mask layers each span a plurality of first mask layers. In this way, the second mask layers can achieve the effect of supporting and fixing the first mask layers, thus preventing the first sub-mask layers from displacement or tilt. Moreover, the first sub-mask layers are in contact with the active regions. Therefore, the second mask layers can also achieve the effect of fixing and supporting the active regions through the first sub-mask layers, thus preventing the active regions from shift or collapse. In addition, after a part of each of the first sub-mask layers is removed, the active regions and the isolation structure are etched by using the second mask layers as a mask, to form the word line trench. That is, the second mask layers are also used as a mask layer to form the word line trench, thus simplifying the production process and improving the yield of the semiconductor structure.

The invention claimed is:

1. A method of manufacturing a semiconductor structure, comprising:
   providing a base;
   forming a plurality of discrete first mask layers and a plurality of discrete second mask layers on the base, wherein the first mask layers each extend along a first direction, the second mask layers each extend along a second direction, the first direction is different from the second direction, the first mask layers intersect the second mask layers, and the second mask layers each span a plurality of the first mask layers;
   cutting off the first mask layers to form a plurality of discrete first sub-mask layers, wherein the second mask layers each span a plurality of the first sub-mask layers, and partial sidewalls of each of the first sub-mask layers are covered by the second mask layers;
etching the base through a first etching process by using the first sub-mask layers as a mask, to form discrete active regions;
forming a isolation structure located between adjacent active regions, and removing the first sub-mask layers not covered by the second mask layers; and
after a part of each of the first sub-mask layers is removed, etching the active regions and the isolation structure by using the second mask layers as a mask, to form a word line trench.

2. The method of manufacturing a semiconductor structure according to claim 1,
wherein after a part of each of the first sub-mask layers is removed, the method further comprises: forming a third mask layer on two opposite sidewalls of each of the second mask layers; and
forming the word line trench, comprising: etching the active regions and the isolation structure by using the second mask layers and the third mask layers as a mask.

3. The method of manufacturing a semiconductor structure according to claim 2, wherein in a direction perpendicular to the second direction, a ratio of a width of the second mask layer to a width of the third mask layer is 4:1 to 6:1.

4. The method of manufacturing a semiconductor structure according to claim 1, wherein forming the first mask layers and the second mask layers comprises:
forming an initial first mask layer on the base;
forming discrete seventh mask layers on the initial first mask layer, wherein the seventh mask layers each extend along the first direction;
forming a first sidewall layer on each sidewall of the seventh mask layers;
removing the seventh mask layers, and forming a second sidewall layer on each sidewall of the first sidewall layers;
removing the first sidewall layers, and etching the initial first mask layer by using the second sidewall layers as a mask, to form the first mask layers;
forming an initial second mask layer located between adjacent first mask layers; and
patterning the initial second mask layer by using a second etching process, to form the second mask layers.

5. The method of manufacturing a semiconductor structure according to claim 4, wherein an etching gas of the second etching process comprises $O_2$ and Ar.

6. The method of manufacturing a semiconductor structure according to claim 4, wherein the initial second mask layer is also located on the first mask layers; and
in a direction perpendicular to a top surface of the base, top surfaces of the second mask layers are higher than top surfaces of the first mask layers.

7. The method of manufacturing a semiconductor structure according to claim 1, wherein forming the first mask layers and the second mask layers comprises:
forming an initial second mask layer on the base;
patterning the initial second mask layer to form the discrete second mask layers;
forming an initial first mask layer located between adjacent second mask layers;
forming discrete seventh mask layers on the initial first mask layer, wherein the seventh mask layers each extend along the first direction;
forming a first sidewall layer on each sidewall of the seventh mask layers;
removing the seventh mask layers, and forming a second sidewall layer on each sidewall of the first sidewall layers; and
removing the first sidewall layers, and etching the initial first mask layer by using the second sidewall layers as a mask, to form the first mask layers.

8. The method of manufacturing a semiconductor structure according to claim 7, wherein the initial first mask layer is also located on the second mask layers; and
in a direction perpendicular to a top surface of the base, top surfaces of the first mask layers are higher than top surfaces of the second mask layers.

9. The method of manufacturing a semiconductor structure according to claim 1, wherein forming the first sub-mask layers comprises: forming a fifth mask layer on the first mask layers, and patterning the fifth mask layer to form discrete cutoff holes exposing the first mask layers; and etching the first mask layers along the cutoff holes to form the first sub-mask layers.

10. The method of manufacturing a semiconductor structure according to claim 9, wherein the cutoff holes comprise first cutoff holes and second cutoff holes; and for each of the first mask layers, orthographic projections of the first cutoff holes and the second cutoff holes on a top surface of the first mask layer is alternately arranged; and
forming the cutoff holes comprises: performing first patterning on the fifth mask layer to form the first cutoff holes; forming a sixth mask layer on the fifth mask layer after the first cutoff holes are formed, and patterning the sixth mask layer; and performing second patterning on the fifth mask layer by using the patterned sixth mask layer as a mask, to form the second cutoff holes.

11. The method of manufacturing a semiconductor structure according to claim 1, wherein forming the first sub-mask layers comprises: forming a fifth mask layer on the first mask layers, and patterning the fifth mask layer to form second trenches exposing the first mask layers and the second mask layers; and etching the first mask layers by using the fifth mask layer as a mask, to form the first sub-mask layers.

12. The method of manufacturing a semiconductor structure according to claim 1, wherein the first etching process comprises plasma etching; according to the plasma etching, parts of the base are removed through ion beams; and the ion beams tilt 0° to 30° toward a bottom of the base along the first direction, to remove parts of the base located right below the second mask layers.

13. The method of manufacturing a semiconductor structure according to claim 1, wherein an etch selectivity of the first etching process for the base and the second mask layers is greater than 10.

14. The method of manufacturing a semiconductor structure according to claim 1, wherein both the first mask layers and the second mask layers are hard mask layers.

15. The method of manufacturing a semiconductor structure according to claim 1, wherein after the word line trench is formed, the method further comprises: forming a word line filling the word line trench.

* * * * *